United States Patent
Raorane et al.

(10) Patent No.: US 10,375,832 B2
(45) Date of Patent: Aug. 6, 2019

(54) METHOD OF FORMING AN INTERFERENCE SHIELD ON A SUBSTRATE

(71) Applicant: Intel Corporation, Santa Clara, CA (US)

(72) Inventors: Digvijay A. Raorane, Chandler, AZ (US); Kemal Aygun, Chandler, AZ (US); Daniel N. Sobieski, Phoenix, AZ (US); Drew W. Delaney, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 202 days.

(21) Appl. No.: 14/956,214

(22) Filed: Dec. 1, 2015

(65) Prior Publication Data

US 2016/0088738 A1 Mar. 24, 2016

Related U.S. Application Data

(62) Division of application No. 14/227,929, filed on Mar. 27, 2014, now Pat. No. 9,232,686.

(51) Int. Cl.
*H05K 1/02* (2006.01)
*H05K 1/18* (2006.01)
(Continued)

(52) U.S. Cl.
CPC ............. *H05K 3/007* (2013.01); *C23C 14/14* (2013.01); *H01L 23/3128* (2013.01);
(Continued)

(58) Field of Classification Search
CPC ............. H01L 2224/97; H01L 2224/82; H01L 2224/83; H01L 21/4857; H01L 21/561;
(Continued)

(56) References Cited

U.S. PATENT DOCUMENTS 4,954,877 A * 9/1990 Nakanishi ......... H01L 23/49827
257/659
6,207,536 B1 * 3/2001 Matsumoto ......... C23C 14/0078
438/478

(Continued)

OTHER PUBLICATIONS

Colaneri, N. F., et al., "EMI shielding measurements of conductive polymer blends", IEEE Transactions on Instrumentation and Measurement, vol. 41, No. 2, (Apr. 1992), 291-297.

(Continued)

*Primary Examiner* — Minh N Trinh
(74) *Attorney, Agent, or Firm* — Schwabe, Williamson & Wyatt, P.C.

(57) ABSTRACT

An apparatus including a die including a device side with contact points and lateral sidewalls defining a thickness of the die; a build-up carrier coupled to the die, the build-up carrier including a plurality of alternating layers of patterned conductive material and insulating material, wherein at least one of the layers of patterned conductive material is coupled to one of the contact points of the die; and an interference shield including a conductive material disposed on the die and a portion of the build-up carrier. The apparatus may be connected to a printed circuit board. A method including forming a build-up carrier adjacent a device side of a die including a plurality of alternating layers of patterned conductive material and insulating material; and forming a interference shield on a portion of the build-up carrier.

12 Claims, 7 Drawing Sheets

(51) Int. Cl.
| | |
|---|---|
| *H05K 3/00* | (2006.01) |
| *H05K 3/02* | (2006.01) |
| *H05K 3/30* | (2006.01) |
| *H05K 3/46* | (2006.01) |
| *C23C 14/14* | (2006.01) |
| *H01L 21/48* | (2006.01) |
| *H01L 21/56* | (2006.01) |
| *H01L 23/00* | (2006.01) |
| *H01L 23/31* | (2006.01) |
| *H01L 23/498* | (2006.01) |
| *H01L 23/538* | (2006.01) |
| *H01L 23/552* | (2006.01) |

(52) U.S. Cl.
CPC ........ *H01L 23/5389* (2013.01); *H01L 23/552* (2013.01); *H01L 24/19* (2013.01); *H01L 24/97* (2013.01); *H05K 1/0219* (2013.01); *H05K 1/185* (2013.01); *H05K 3/02* (2013.01); *H05K 3/30* (2013.01); *H05K 3/4682* (2013.01); *H01L 21/4857* (2013.01); *H01L 21/561* (2013.01); *H01L 21/568* (2013.01); *H01L 23/49811* (2013.01); *H01L 23/49822* (2013.01); *H01L 2224/04105* (2013.01); *H01L 2224/12105* (2013.01); *H01L 2224/16227* (2013.01); *H01L 2224/73267* (2013.01); *H01L 2224/83005* (2013.01); *H01L 2224/92244* (2013.01); *H01L 2224/97* (2013.01); *H01L 2924/1815* (2013.01); *H01L 2924/18162* (2013.01); *H05K 2201/0715* (2013.01); *H05K 2203/1469* (2013.01); *H05K 2203/308* (2013.01)

(58) Field of Classification Search
CPC ........ H01L 21/568; H01L 2224/04105; H01L 2224/12105; H01L 2224/16227
See application file for complete search history.

(56) References Cited

U.S. PATENT DOCUMENTS

| | | | | |
|---|---|---|---|---|
| 6,225,694 | B1 * | 5/2001 | Terui | H01L 23/49811 257/693 |
| 6,998,532 | B2 * | 2/2006 | Kawamoto | H01L 24/16 174/521 |
| 7,799,602 | B2 * | 9/2010 | Pagaila | H01L 21/565 257/E21.007 |
| 7,928,538 | B2 * | 4/2011 | Salzman | H01L 23/552 257/659 |
| 8,692,362 | B2 * | 4/2014 | Wang | H01L 21/563 257/678 |
| 8,829,667 | B2 * | 9/2014 | Park | H01L 23/552 257/692 |
| 9,070,793 | B2 * | 6/2015 | Liao | H01L 23/3121 |
| 9,232,686 | B2 * | 1/2016 | Raorane | H01L 23/5389 |
| 9,236,356 | B2 * | 1/2016 | Yang | H01L 23/60 |
| 9,907,179 | B2 * | 2/2018 | Kawabata | H01F 1/0306 |
| 2004/0252475 | A1 * | 12/2004 | Tsuneoka | H01L 23/3121 361/816 |
| 2006/0266547 | A1 * | 11/2006 | Koga | H01L 21/561 174/255 |
| 2008/0217762 | A1 * | 9/2008 | Wong | H01L 21/6835 257/700 |
| 2010/0224969 | A1 | 9/2010 | Tang | |
| 2012/0161316 | A1 | 6/2012 | Gonzalez | |
| 2015/0052743 | A1 * | 2/2015 | Kawabata | H01L 21/67092 29/829 |
| 2015/0271959 | A1 * | 9/2015 | Chen | H05K 9/0024 361/760 |
| 2016/0088738 | A1 * | 3/2016 | Raorane | H01L 23/5389 29/832 |
| 2017/0005042 | A1 * | 1/2017 | Chen | H01L 23/552 |

OTHER PUBLICATIONS

Intel Corporation, Notice of Allowance for U.S. Appl. No. 14/227,929, (dated Sep. 10, 2015).

Isern-Flecha, I., "Surface studies of electroless nickel/copper plated polycarbonate subjected to Batelle class II flowing mixed gas environment", J. Vac. Sci. Technol. A, 7(3), (1989), 1702-1705.

Jackson, B. C., et al., "A practical guide on the use of electroless coatings for EMI shielding", 9th International Conference on Electromagnetic Compatibility, Conference Publication No. 396, (1994), 119-124.

\* cited by examiner

METHOD OF FORMING AN INTERFERENCE SHIELD ON A SUBSTRATE

CROSS-REFERENCE TO RELATED APPLICATION

The application is a divisional of co-pending U.S. patent application Ser. No. 14/227,929, filed Mar. 27, 2014, and incorporated herein by reference.

FIELD

Integrated circuit packaging.

BACKGROUND

Electromagnetic interference (EMI) is a disturbance to the electric field due to either electromagnetic induction or electromagnetic radiation emitted from an external source. While EMI exists across the entire electromagnetic spectrum, from direct current (dc) electricity at less than one hertz (Hz) to gamma rays above 1E20 Hz, the great majority of EMI problems are limited to that part of the spectrum between 25 kHz and 10 GHz. This portion is known as the radio frequency interference (RFI) area and covers radio and audio frequencies. The acronym EMI is generally used to represent both EMI and RFI. Radio frequency interference is also described as any undesirable electrical energy with content within the frequency range dedicated to radio frequency transmission. Radiated RFI is most often found in the frequency range from 30 MHz to 10 GHz. These may be transient, continuous or intermittent in occurrence. External sources could be communication and radar transmitters, electric switch contacts, computers, voltage regulators, pulse generators, arc/vapor lamps, intermittent ground connections, solar noise, lightening electromagnetic pulses.

EMI affects the ability of high-performance electronic devices to maintain signal integrity in the time domain and for power integrity in the frequency domain. For integrated circuits, it is RF frequency that generally matters the most for mobile devices. Electromagnetic radiation generated by one electronic RF device may negatively affect other, similar, electronic devices such as cell phones, radios. For example, when a cell phone is ON, a great deal of power is transmitted. Such power interferes with RF frequencies of other devices. EMI/RFI shielding is necessary in telecomm because radio transmissions can hamper the reception of a signal by a recipient if the signals are near the same frequency. EMI/RFI shielding may prevent incorrect frequencies from interfering with a device. Another example where electromagnetic radiation is a concern is in a hospital. In a hospital, many forms of medical equipment generally must meet standards set by the Food and Drug Administration (FDA) to limit machinery from being affected by cell phones, personal digital assistants, or other electronic devices. EMI/RFI shielding helps to make such protections possible.

Bumpless build-up layer (BBUL) packaging technology is based on coreless architecture in the sense that a BBUL package or panel is separated from a core on which it is formed. The core is made up of pre-peg material, inner copper foil and outer copper foil. In vacuum based architecture, inner and outer copper foils are in contact due to vacuum created between them. In adhesive based architectures, the inner and outer copper foils are held together by a low peel strength grade adhesive between them. Core material (pre-peg) adheres to inner and outer copper foil. In order to get a coreless package, build layers are built on both sides of the core. Build-up layers are constructed by laminating, curing, drilling and desmearing dry film dielectric layers followed by semi-additive plating (SAP) process. After the desired build-up layers are laminated, the panel is routed along designated areas. The routing results in separation of the outer copper foil from the inner copper foil. Thus, the core is separated from the package(s) or panel(s). The exposed outer copper foil is then etched and any etch stop material is then removed. Thus, the final package consists of only build-up layers and embedded die or dice. Such a BBUL package is now ready for connection to a motherboard.

BBUL package is targeted for low Z height products such as mobile chips/devices. Some of these chips operate at RF frequencies and are bound to face the issue of EMI/RFI.

DETAILED DESCRIPTION

Figure 1:
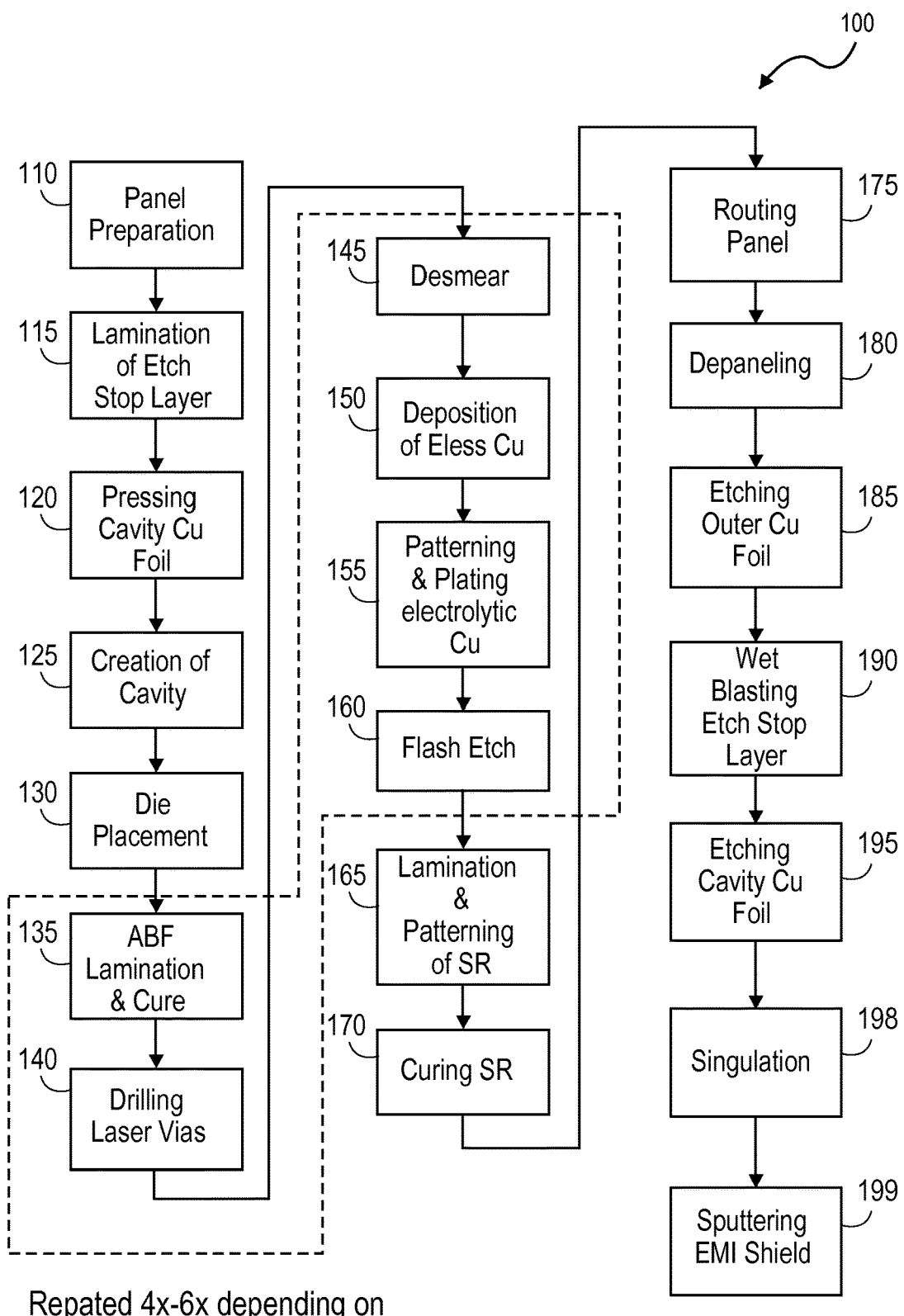
FIG. 1 shows a flow chart of a method to form a BBUL package or panel including an interference shield.

FIG. 1 shows a flow chart of a method to form a BBUL package or panel including an interference shield (e.g., an EMI and/or RFI shield). FIGS. 2-11 illustrate an embodiment of a method of forming a BBUL package including an interference shield representatively according to the process illustrated in FIG. 1. In the following paragraphs describing FIGS. 2-11, reference will be made to method 100 of FIG. 1.

Figure 2:
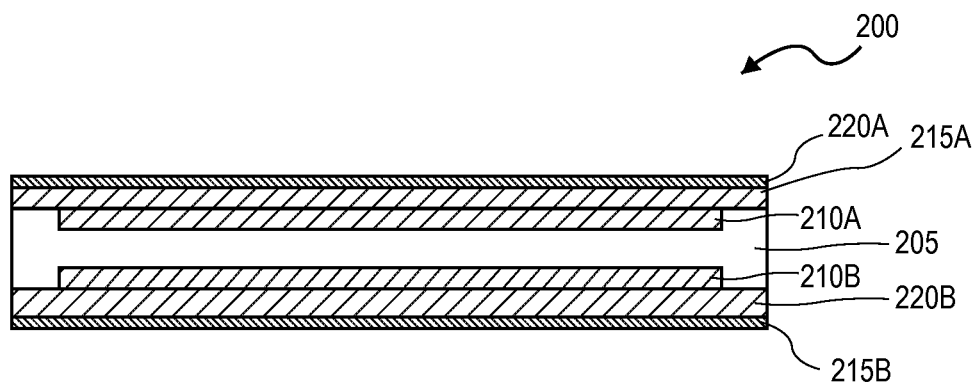
FIG. 2 shows a cross-sectional side view of a portion of a sacrificial material or core substrate having copper foil formed on opposing sides thereof and an etch stop layer on the copper foils. For vacuum architecture, in one embodiment, inner copper foil 210A/210B is shorter than outer copper foil 215A/215B so that the prepreg material can adhere to inner copper foil and outer copper foil 215A/215B and hence, hold them together.

FIG. 2 shows a cross-sectional side view of a portion of a sacrificial material or core substrate having copper foil formed thereon as part of a panel preparation process (block 110, FIG. 1). FIG. 2 shows substrate 205 of, for example, a pre-peg material. On opposing sides of substrate 205 is inner copper foil 210A and inner copper foil 210B, respectively. Overlying each inner copper foil is outer copper foil 215A and outer copper foil 215B, respectively. In one embodiment, the copper foils are pressed or glued together to form a panel. For vacuum architecture, in one embodiment, inner copper foil 210A/210B is shorter than outer copper foil 215A/215B so that the prepreg material can adhere to inner copper foil and outer copper foil 215A/215B and hence, hold them together. In the embodiment shown in FIG. 2, the panel preparation also includes the introduction of etch stop materials 220A and 220B on outer copper foil 215A and outer copper foil 215B, respectively. A representative material for etch stop layer 220A and etch stop layer 220B is a polymer or dielectric build up layer that is resistant to a copper etch chemistry introduced as a film or sheet on outer copper foil 215A/215B (block 115, FIG. 1).

Figure 3:
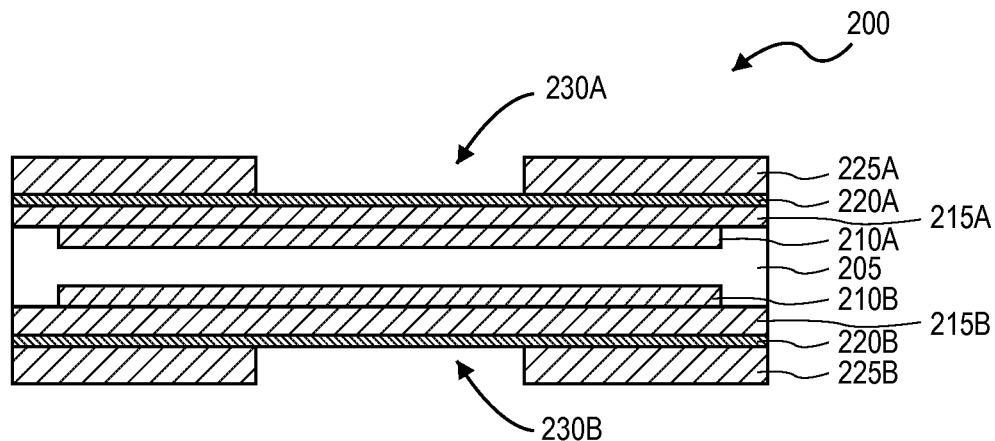
FIG. 3 shows the structure of FIG. 2 following the introduction of a sacrificial copper foil on opposing sides of the structure and the formation of a cavity in each sacrificial foil.

FIG. 3 shows the structure of FIG. 2 following the introduction of a sacrificial copper foil on opposing sides of structure 200. Representatively, sacrificial copper foil 225A and sacrificial copper foil 225B are pressed on to the structure (block 120, FIG. 1). Representatively, each sacrificial copper foil has a thickness approximating a thickness of a die.

FIG. 3 also shows the structure following a formation of a cavity in each of sacrificial copper foil 225A and sacrificial copper foil 225B, respectively (block 125, FIG. 1). In one embodiment, cavity 230A and cavity 230B each has a depth such that the underlying etch stop layer (etch stop layer 220A and etch stop layer 220B, respectively) is exposed. A representative dimension of cavity 230A/230B (corresponding, in one embodiment, to a thickness of copper foil 225A/225B) is at least an area large enough to accommodate a die or dies.

Figure 4:
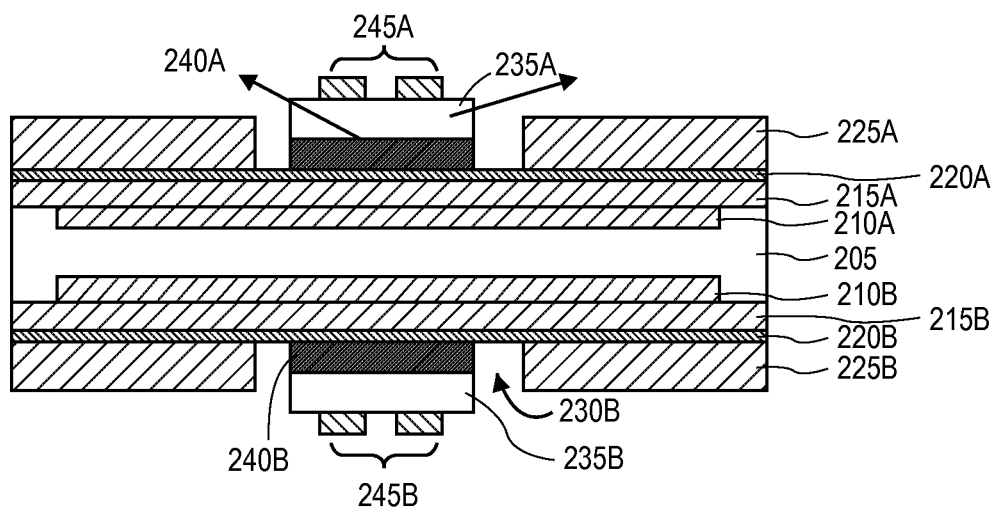
FIG. 4 shows the structure of FIG. 3 following the introduction of a die in the respective cavities.

FIG. 4 shows the structure of FIG. 3 following the introduction of a die in the respective cavities (block 130, FIG. 1). FIG. 4 shows die 235A placed in cavity 230A and bonded to etch stop layer 220A with die backside film (DBF) 240A. Similarly, FIG. 4 shows die 235B placed in cavity 230B and bonded to etch stop layer 220B by DBF 240B. Each of die 235A and die 235B is mounted with a device side away from substrate 205. In the illustrated embodiment, the device side of each die 235A and die 235B includes conductive pillars 245A and conductive pillars 245B, respectively, to respective contacts on the respective die. Such pillars may be formed at the die fabrication stage.

Figure 5:
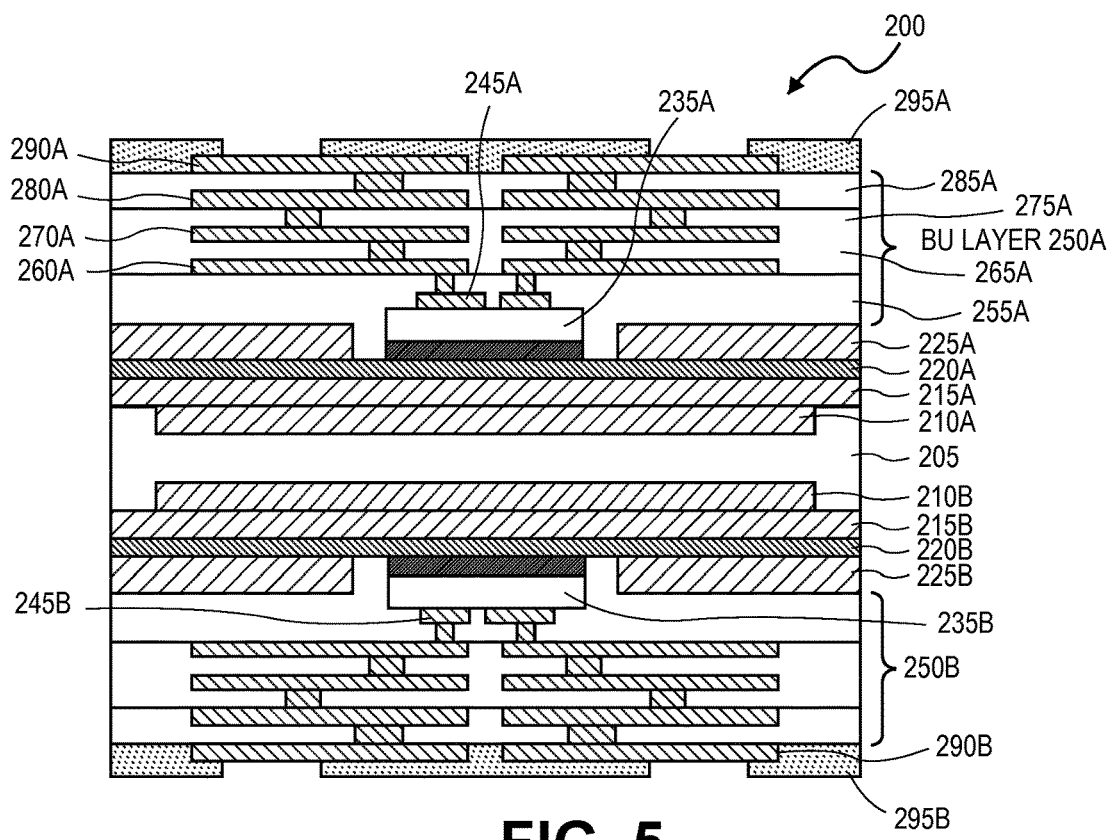
FIG. 5 shows the structure of FIG. 4 following the formation of build-up layers on opposing sides of the structure.

FIG. 5 shows the structure of FIG. 4 following the formation of a build-up carrier build-up layers on opposing sides of the structure. FIG. 5 shows build-up carrier 250A of alternating layers of patterned conductive material and insulating material on sacrificial copper panel 225A and build-up carrier 250B of alternating layers of patterned conductive material and insulating material on sacrificial copper panel 225B (on a device side of die 235A and die 235B, respectively). A process of forming build-up layers will be described with reference to build-up carrier 250A. Representatively, initially, a layer of dielectric material 255A is introduced on die 235A and sacrificial copper panel 225A. In one embodiment, dielectric material 255A is a dielectric build-up layer material that is a film or sheet that is laminated to the die and copper panel 225A (block 135, FIG. 1). Following the introduction of dielectric material 255A, openings are formed to contacts on die 235 (or, where die 235 includes pillars 245A on or to the contacts, openings to pillars 245A). One way to form openings to die contacts or pillars 245A is through a laser drilling process (block 140, FIG. 1). Following forming the openings or vias to die contacts or pillars 245A, the vias are desmeared (block 145, FIG. 1). An electroless copper material may then be introduced/deposited in the vias and on a surface of dielectric film 255A (block 150, FIG. 1). A pattern mask may then be introduced on the surface of dielectric material 255A including the electroless copper material. The patterning defines a trace routing for a first conductive level through, for example, openings in the mask. Electrolytic copper is then plated on the exposed electroless copper on dielectric film 255A and in the vias (block 155, FIG. 1). Following electrolytic copper plating, a mask used to define the pattern (e.g., a DFR mask) is removed by, for example, stripping to leave copper traces (conductive material). A flash etch is then carried out to remove the exposed electroless copper between the formed traces (block 160, FIG. 1).

The above processes associated with introducing a dielectric material and a patterned conductive layer may be repeated multiple times until a desired number of build-up layers are formed. FIG. 5 shows build-up carrier 250A including conductive layers 260A, 270A, 280A and 290A disposed between dielectric materials 255A, 265A, 275A and 285A. The conductive layers are separated by layers of dielectric material (layers of dielectric material are intermingled between conductive layers) to electrically separate the layers and form a build-up carrier of alternating layers of patterned conductive material and insulating material. Following the patterning of the last conductive material layer, a final dielectric material of, for example, solder resist may be introduced (block 165, FIG. 1). FIG. 5 shows dielectric layer 295A of, for example, a laminated solder resist film introduced on patterned conductive layer 290A and dielectric layer 295B of a similar material introduced on pattern. FIG. 5 also shows patterning of dielectric layer 295A to form openings to conductive layer 290A for, for example, solder connections to the panel. Dielectric layer 295B is similarly patterned. Following the introduction and patterning of dielectric layer 295A of, for example, a solder resist, the dielectric layer may be cured (block 170, FIG. 1).

Figure 6:
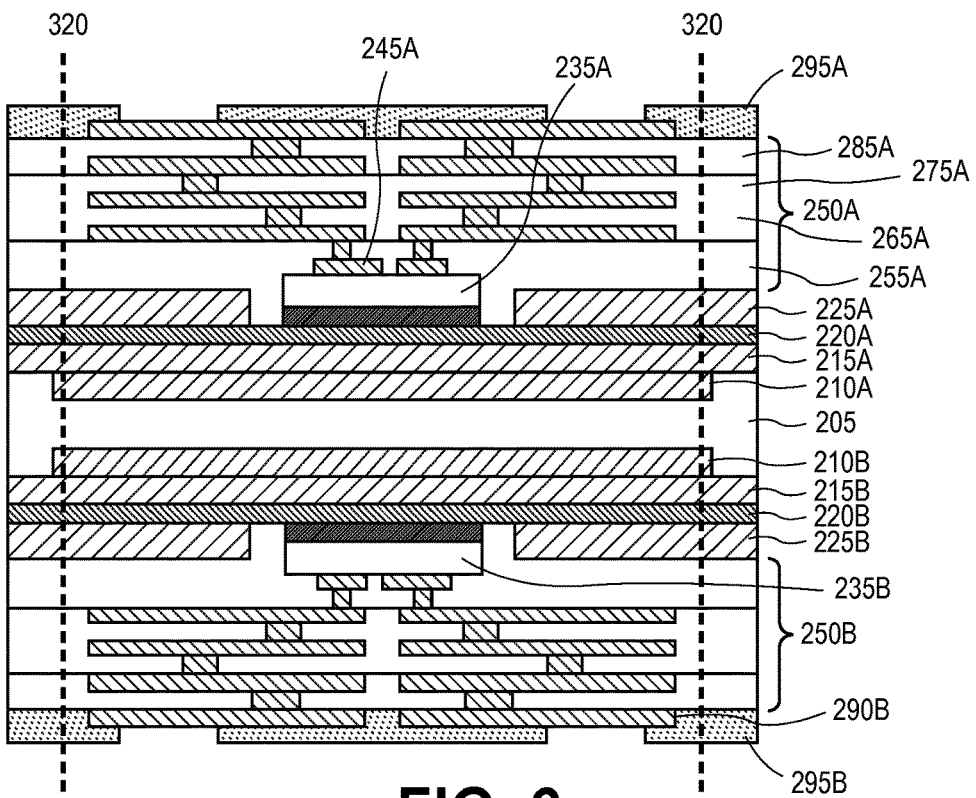
FIG. 6 shows the structure of FIG. 5 and illustrates designated routing lines.
Figure 7:
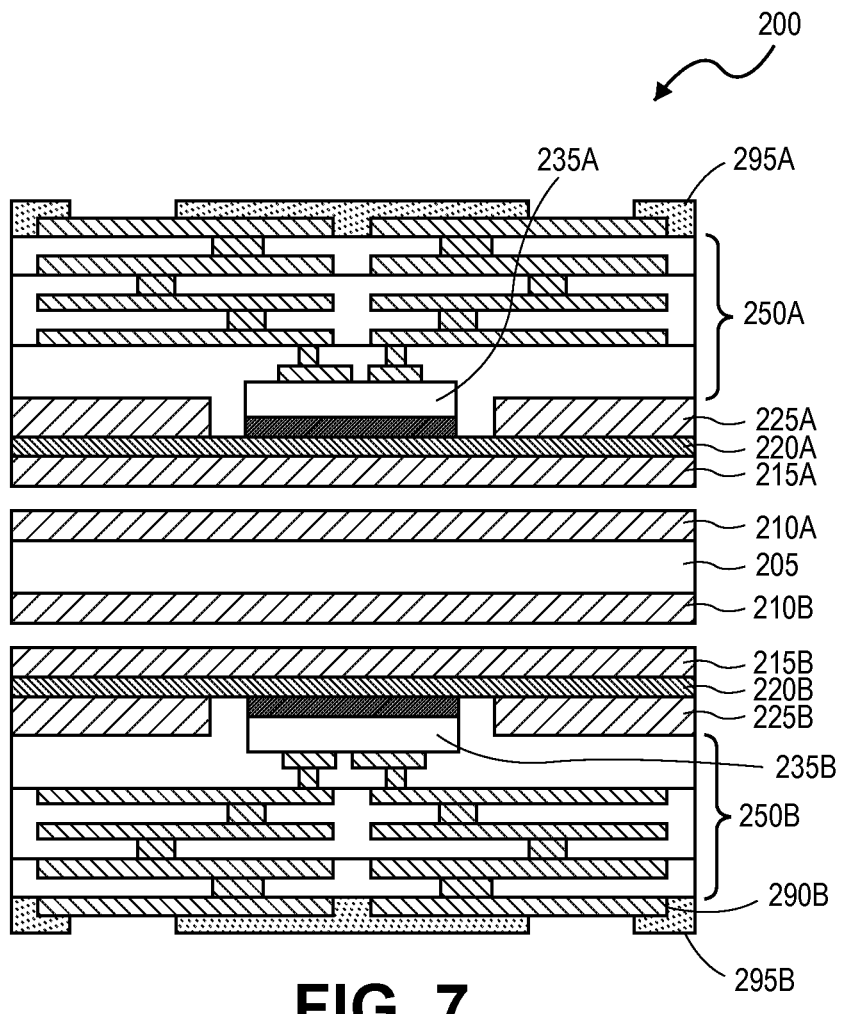
FIG. 7 shows the of FIG. 6 structure separated at the outer copper foils.

FIG. 6 shows the structure of FIG. 5 and illustrates routing of structure 200 (block 175, FIG. 1). As illustrated in FIG. 6, both sides of substrate 205 include a die embedded in build-up packaging layers. In order to separate a BBUL package or panel from substrate 205 and associated copper foils (copper foils 210A/210B, 215A/215B), in one embodiment, structure 200 is routed along its perimeter on all four sides of the panel. FIG. 6 shows routing lines 310 and 320 on opposite sides (two opposite sides shown) of structure 200. Routing may be accomplished with, for example, a Hitachi router. The routing removes any adhesive that holds the inner copper foils 210A/210B and outer copper foils 215A/215B and substrate 205 together. In such manner, inner copper foils 210A/210B get detached from outer copper foils 215A/215B. FIG. 7 shows the separated structure.

Figure 8:
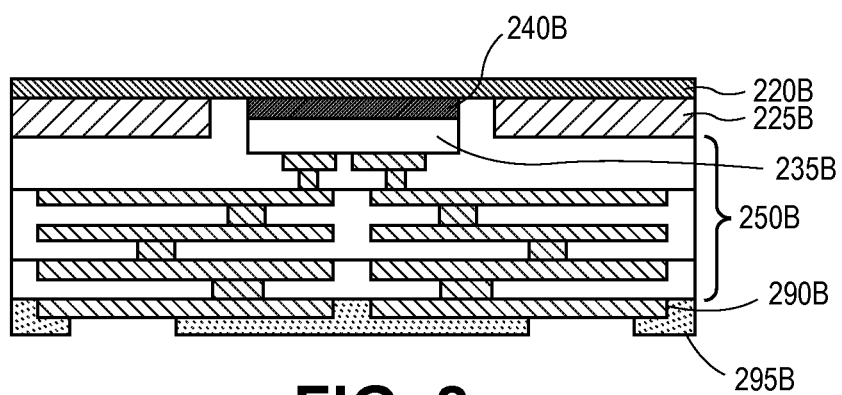
FIG. 8 shows one of the two BBUL packages or panel separated from the substrate in FIG. 7 following the removal of the inner copper foil from the structure.

Following the separation, outer copper foils 215A and 215B are removed from each separated panel or package (block 185, FIG. 1). One way a copper foil may be removed is by an etching process. FIG. 8 shows one of the two BBUL packages or panel separated from substrate 205 in FIG. 7. FIG. 8 shows the structure after the outer copper foil is removed (e.g., outer copper foil 215B). A suitable etching technique to remove the copper panel is a wet chemical etchant. FIG. 8 shows etch stop layer 220B exposed on the substrate.

Figure 9:
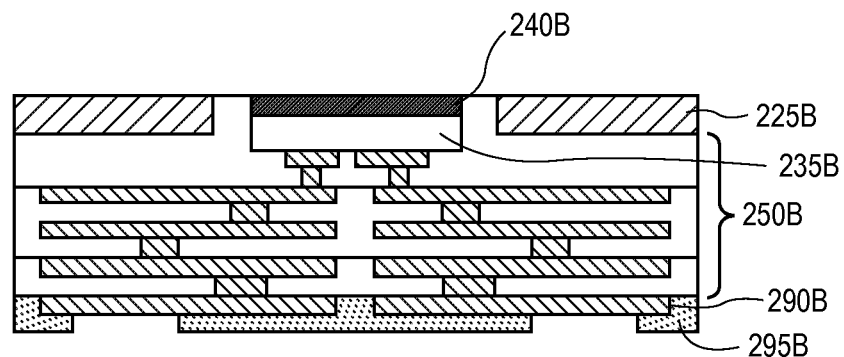
FIG. 9 shows the structure of FIG. 8 following the removal of the etch stop layer.
Figure 10:
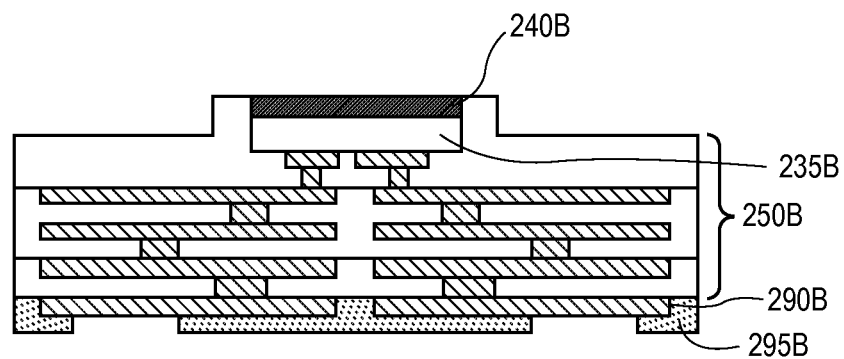
FIG. 10 shows the structure of FIG. 9 following the removal of the sacrificial copper foil.

FIG. 9 shows the structure of FIG. 8 following the removal of etch stop layer 220B. In one embodiment, etch stop layer may be removed by exposing the layers to a wet blaster (block 190, FIG. 1). A wet blaster process provides selectivity in removing the etch stop layer while leaving the sacrificial copper foil 225B and DBF layer 240B.

Following the removal of etch stop layer 220B, the sacrificial copper foil 225B is removed. One technique for removing sacrificial copper foil 225B is by an etching process using a chemical solution similar to etching the outer copper foil as described above (block 195, FIG. 1). FIG. 9 shows the structure following the removal of the sacrificial copper foil.

The above process may be formed on a large substrate such that multiple panels or packages may be formed simultaneously on each side of, for example, substrate 205. The removal of sacrificial copper foil 220B, the structure may be singulated into individual units (block 198, FIG. 1). One singulation process is a sawing or cutting process.

Figure 11:
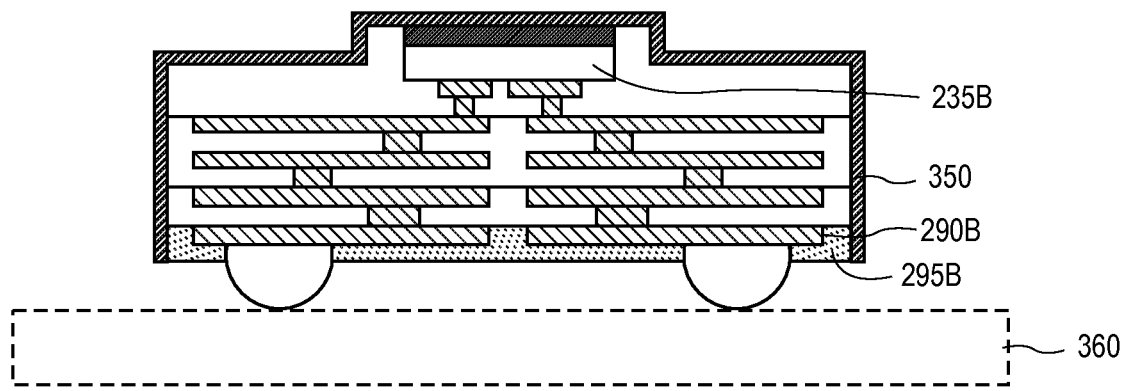
FIG. 11 shows the structure of FIG. 10 following the coating of shield material 350 on the BBUL package or panel and connecting the package or panel to a printed circuit board.

Once the BBUL package or panel is singulated, a shield layer is introduced on the package or panel. FIG. 11 shows the structure of FIG. 10 following the coating of shield material 350 on the package. In one embodiment, a shield layer is a conductive material such as a metal that may be introduced by, for example, a sputtering process to coat the metal on the package. Representatively, an individual BBUL package may be placed in a vacuum chamber along with a target metal for a sputtering process. A plasma is introduced into the vacuum chamber. The plasma strikes the metal target. The metal target is then bombarded by energetic particles from the plasma. Liberated atoms from the target metal are deposited on the package along the line of site. Representatively, an argon plasma is used. Suitable metals for an interference shield (e.g., EMI and/or RFI shield) include, but are not limited to, nickel and copper. In another embodiment, multiple metals may be used, such as layers of nickel and copper. In one embodiment, a total thickness of a metal layer, or a metal stack consisting of different metals with the same or different thicknesses is less than about six microns and, in another embodiment, less than about three microns.

FIG. 11 also shows the structure (a BBUL package including die 235) connected to substrate 360 such as a printed circuit board through, for example, solder connections to conductive material layer 290B.

Figure 12:
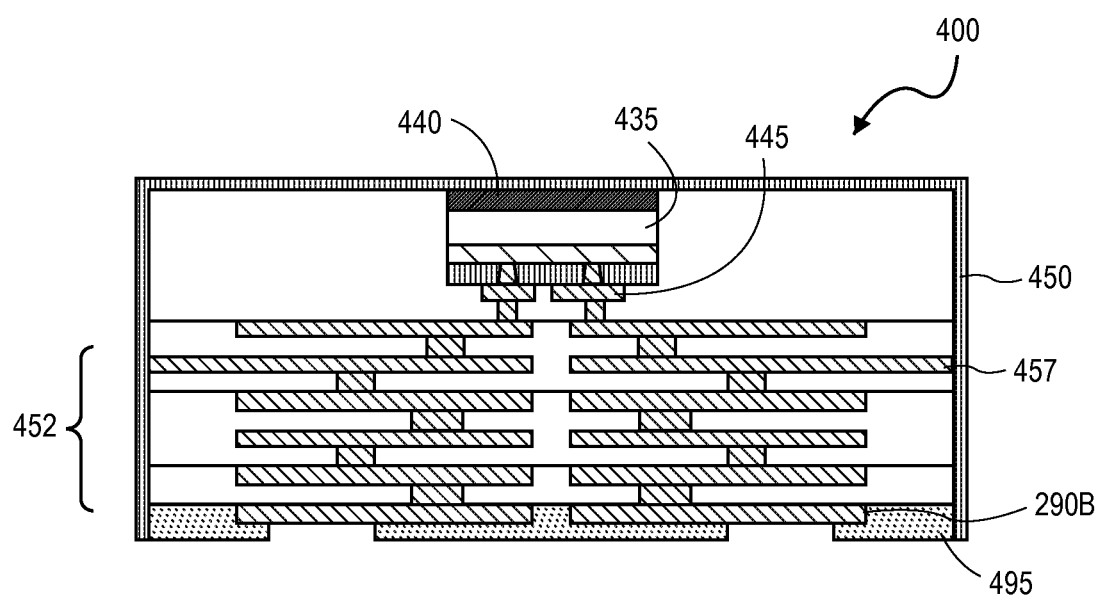
FIG. 12 shows a cross-sectional side view of another embodiment of a package substrate including an interference shield variation of proposed metal shield.

FIG. 12 shows a cross-sectional side view of another embodiment of a package substrate including an interference shield. In this embodiment, at least one layer of patterned conductive material designated as a ground plane in the package extends its end to one or more sidewalls of build-up carrier 452. FIG. 12 shows layer 457 of conductive material, designated as a ground plane, having dimensions (length and/or width) that extend to at least two opposing sides and in another embodiment to all four sides of build-up carrier 452 (lateral and in and out of page). FIG. 12 shows structure 400 including die 435 including a device side with contact points or pillars 445 and lateral sidewalls defining a thickness of the die. Structure 400 also includes build-up carrier 452 connected to the device side of die 435. The build-up carrier 452 includes a plurality of alternating layers of patterned conductive material and insulating material. FIG. 12 shows at least one of the layers of patterned conductive material is connected to contact points or pillars associated with die 435. FIG. 12 also shows the sidewalls of die 340 embedded in dielectric material (e.g., a dielectric build-up film). Overlying a backside of die 435 is die backside film 440.

In order to minimize an effect on the routing operation of extending at least one layer of conductive material (layer 457), only a portion of the layer(s) could be extended to the perimeter or multiple patterned conductive layers could be extended to the perimeter at different location, thus providing redundancy, and hence ensuring electrical continuity. Interference shield 450 of a metal or metals, when sputtered, makes an electrical contact with patterned conductive layer 457. Thus, where patterned conductive layer 457 is a ground plane, an interference shield can be effectively grounded when chip is turned ON.

Figure 13:
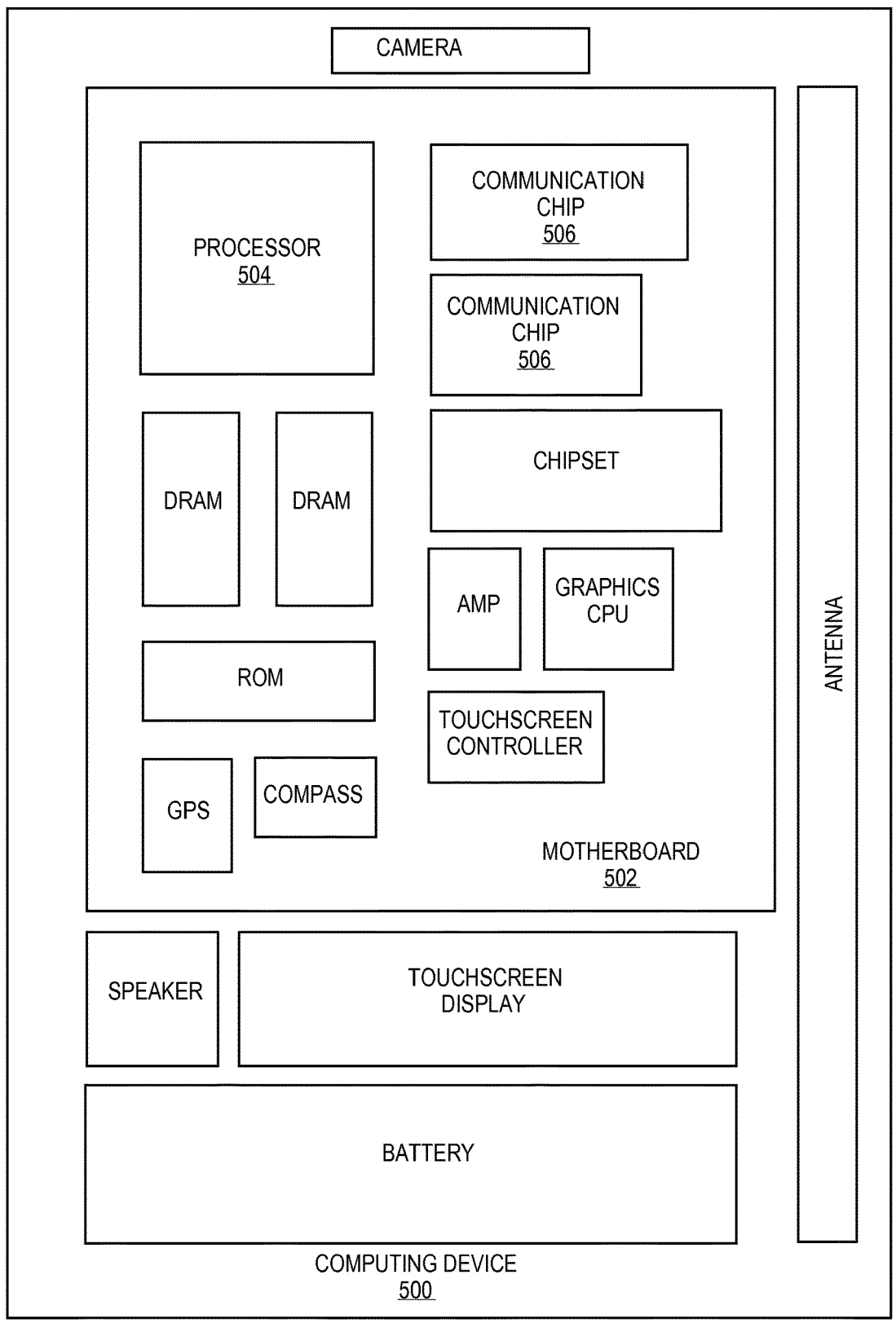
FIG. 13 shows an embodiment of a computing device.

FIG. 13 illustrates a computing device in accordance with one implementation. Computing device 500 houses board 502. Board 502 may include a number of components, including but not limited to processor 504 and at least one communication chip 506. Processor 504 is physically and electrically coupled to board 502. In some implementations at least one communication chip 506 is also physically and electrically coupled to board 502. In further implementations, communication chip 506 is part of processor 504.

Depending on its applications, computing device 500 may include other components that may or may not be physically and electrically coupled to board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, first communication chip 506 may be dedicated to shorter range wireless communications such as Wi-Fi and Bluetooth and second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, a BBUL package technology is employed including a package including an interference shield as described above. The term "processor" may refer to any device or portion of a device that processes electronic data from registers and/or memory to transform that electronic data into other electronic data that may be stored in registers and/or memory.

Communication chip 506 also includes an integrated circuit die packaged within communication chip 506. In accordance with another implementation, a BBUL package technology is employed including a package including an interference shield as described above.

In further implementations, another component housed within computing device 500 may contain an integrated circuit die in a BBUL package including an interference shield as described above.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

EXAMPLES

Example 1 is an apparatus including a die including a first side and an opposite second side including a device side with contact points and lateral sidewalls defining a thickness of the die; a build-up carrier coupled to the second side of the die, the build-up carrier including a plurality of alternating layers of patterned conductive material and insulating material, wherein at least one of the layers of patterned conductive material is coupled to one of the contact points of the die; and an interference shield including a conductive material disposed on the first side of the die and a portion of the build-up carrier.

In Example 2, the interference shield in the apparatus of Example 1 includes a thickness less than three microns.

In Example 3, the interference shield in the apparatus of Example 1 includes a plurality of layers of different conductive materials.

In Example 4, the plurality of different conductive materials in the apparatus of Example 3 includes copper and nickel.

In Example 5, the at least one layer of the layers of patterned conductive material in the apparatus of Example 1 contacts the interference shield.

In Example 6, the at least one layer of the layers of patterned conductive material in the apparatus of Example 1 extends laterally to a width of the build-up carrier such that the at least one layer is exposed at at least one side portion of opposing side portions of the build-up carrier and the interference shield contacts the at least layer at the at least one side portion.

In Example 7, the at least one layer of the layers of patterned conductive material in the apparatus of Example 6 defines a ground plane.

Example 8 is a method including forming a build-up carrier adjacent a device side of a die, the build-up carrier including a plurality of a plurality of alternating layers of patterned conductive material and insulating material, wherein at least one of the layers of patterned conductive material is coupled to one of the contact points of the die; and forming a interference shield on a portion of the build-up carrier.

In Example 9, the interference shield in the method of Example 8 is formed on a surface of the build-up carrier adjacent a backside of the die.

In Example 10, forming the interference shield in the method of Example 9 includes sputtering a target material.

In Example 11, the interference shield in the method of Example 9 includes a plurality of layers of different conductive materials.

In Example 12, the plurality of different conductive materials in the method of Example 10 includes copper and nickel.

In Example 13, forming a build-up carrier in the method Example 12 includes forming the plurality of alternating layers of conductive material and dielectric material on a sacrificial panel and after forming the plurality of alternating layers of conductive material and dielectric material, separating the build-up carrier from the sacrificial panel.

In Example 14, the sacrificial panel in the method of Example 13 includes a conductive material layer having a cavity therein and prior to forming the plurality of alternating layers of conductive material and dielectric material, the method includes placing the die in the cavity and separating the build-up carrier from the sacrificial panel includes removing the conductive material layer having the cavity.

In Example 15, at least one layer of the layers of patterned conductive material in the method of Example 8 contacts the interference shield.

In Example 16, the at least one layer of the layers of patterned conductive material in the method of Example 15 extends laterally to a width of the build-up carrier such that the at least one layer is exposed at at least one side portion of opposing side portions of the build-up carrier and forming the interference shield includes forming the interference shield on the at least one side portion.

In Example 17, the at least one layer of the layers of patterned conductive material in the method of Example 15 defines a ground plane.

Example 18 is an apparatus including a computing device including a package including a microprocessor disposed in a build-up carrier, the microprocessor including a first side and an opposite second side including a device side with contact points, the build-up carrier coupled to the second side of the microprocessor, and including a plurality of alternating layers of patterned conductive material and insulating material, wherein at least one of the layers of patterned conductive material is coupled to one of the contact points of the die; an interference shield including a conductive material disposed on the first side of the die and a portion of the build-up carrier; and a printed circuit board coupled to the package.

In Example 19, the interference shield in the apparatus of Example 18 includes a thickness less than three microns.

In Example 20, the interference shield in the apparatus of Example 18 includes a plurality of layers of different conductive materials.

In Example 21, the plurality of different conductive materials in the apparatus of Example 20 includes copper and nickel.

In Example 22, at least one layer of the layers of patterned conductive material in the apparatus of Example 18 contacts the interference shield.

In Example 23, the at least one layer of the layers of patterned conductive material in the apparatus of Example 22 extends laterally to a width of the build-up carrier such that the at least one layer is exposed at at least one side portion of opposing side portions of the build-up carrier and the interference shield contacts the at least layer at the at least one side portion.

In Example 24, the at least one layer of the layers of patterned conductive material in the apparatus of Example 22 defines a ground plane.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method of forming an interference shield on a substrate, the method comprising:
    providing a die comprising contact points;
    forming a build-up carrier adjacent a device side of the die, the build-up carrier comprising a plurality of alternating layers of patterned conductive material and insulating material, wherein at least one of the layers of patterned conductive material is coupled to one of the contact points of the die, wherein the die is embedded in the build-up carrier, wherein forming the build-up carrier comprises forming the plurality of alternating layers of conductive material and dielectric material on a sacrificial panel, and after forming the plurality of alternating layers of conductive material and dielectric material, separating the build-up carrier from the sacrificial panel; and
    forming an interference shield on a top and sidewalls of the build-up carrier, wherein the portion of the interference shield on the top of the build-up carrier is non-planar.

2. The method of claim 1, wherein the interference shield is formed on a surface of the build-up carrier adjacent a backside of the die.

3. The method of claim 2, wherein forming the interference shield comprises sputtering a target material.

4. The method of claim 2, wherein the interference shield comprises a plurality of layers of different conductive materials.

5. The method of claim 4, wherein the plurality of different conductive materials comprise copper and nickel.

6. The method of claim 1, wherein the sacrificial panel comprises a conductive material layer having a cavity therein and prior to forming the plurality of alternating layers of conductive material and dielectric material, the method comprises placing the die in the cavity and separating the build-up carrier from the sacrificial panel comprises removing the conductive material layer having the cavity.

7. The method of claim 1, wherein at least one layer of the layers of patterned conductive material contacts the interference shield.

8. The method of claim 7, wherein the at least one layer of the layers of patterned conductive material extends laterally to a width of the build-up carrier such that the at least one layer is exposed at least one side portion of opposing side portions of the build-up carrier and forming the interference shield comprises forming the interference shield on the at least one side portion.

9. The method of claim 7, wherein the at least one layer of the layers of patterned conductive material defines a ground plane.

10. The method of claim 1, wherein a layer of the layers of patterned conductive material is in direct electrical contact with the interference shield.

11. A method of forming an interference shield on a substrate, the method comprising:
    providing a die comprising contact points;
    forming a build-up carrier adjacent a device side of the die, the build-up carrier comprising a plurality of alternating layers of patterned conductive material and insulating material, wherein at least one of the layers of patterned conductive material is coupled to one of the contact points of the die, wherein forming the build-up carrier comprises forming the plurality of alternating layers of conductive material and dielectric material on a sacrificial panel and after forming the plurality of alternating layers of conductive material and dielectric material, separating the build-up carrier from the sacrificial panel; and
    forming an interference shield on a portion of the build-up carrier, wherein the interference shield is formed on a surface of the build-up carrier adjacent a backside of the die, wherein forming the interference shield comprises sputtering a target material, and wherein the plurality of different conductive materials comprise copper and nickel.

12. The method of claim 11, wherein the sacrificial panel comprises a conductive material layer having a cavity therein and prior to forming the plurality of alternating layers of conductive material and dielectric material, the method comprises placing the die in the cavity and separating the build-up carrier from the sacrificial panel comprises removing the conductive material layer having the cavity.

* * * * *